(12) United States Patent
Yamada et al.

(10) Patent No.: US 7,157,336 B2
(45) Date of Patent: *Jan. 2, 2007

(54) METHOD OF MANUFACTURING SEMICONDUCTOR DEVICE

(75) Inventors: Junji Yamada, Gunma (JP); Yutaka Yamada, Gunma (JP); Junichi Ariyoshi, Mie (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/096,754

(22) Filed: Mar. 13, 2002

(65) Prior Publication Data

US 2002/0173103 A1  Nov. 21, 2002

(30) Foreign Application Priority Data

May 15, 2001 (JP) .................. P. 2001-144116

(51) Int. Cl.
*H01L 21/8234* (2006.01)

(52) U.S. Cl. ............ 438/275; 438/278; 438/FOR. 212; 257/758

(58) Field of Classification Search ................ 438/275, 438/276, 277, 278, 128, 132, 129, 131, FOR. 212; 257/368, 758
See application file for complete search history.

(56) References Cited

U.S. PATENT DOCUMENTS

| 4,255,210 A | * | 3/1981 | Okuyama et al. | ........... 438/128 |
|---|---|---|---|---|
| 5,278,078 A | * | 1/1994 | Kanebako et al. | ........... 438/276 |
| 5,350,703 A | * | 9/1994 | Lee | ............. 438/278 |
| 5,378,649 A | * | 1/1995 | Huang | ......... 438/278 |
| 5,459,100 A | * | 10/1995 | Choi | ............ 438/624 |
| 5,512,507 A | * | 4/1996 | Yang et al. | ........... 438/598 |
| 5,514,610 A | * | 5/1996 | Wann et al. | ........... 438/278 |
| 5,620,926 A | * | 4/1997 | Itoh | .......... 438/530 |
| 5,731,634 A | * | 3/1998 | Matsuo et al. | ........... 257/752 |
| 5,824,585 A | * | 10/1998 | Wen | ......... 438/275 |
| 5,891,780 A | * | 4/1999 | Hasegawa et al. | ......... 438/278 |
| 5,994,745 A | * | 11/1999 | Hong | ......... 257/390 |
| 6,054,353 A | * | 4/2000 | Sheu et al. | ........... 438/275 |
| 6,146,949 A | * | 11/2000 | Wu | ............ 438/275 |
| 6,150,198 A | * | 11/2000 | Wen | ............ 438/128 |
| 6,187,638 B1 | * | 2/2001 | Wen | ........... 438/278 |
| 6,221,722 B1 | * | 4/2001 | Lee | ............ 438/275 |
| 6,265,270 B1 | * | 7/2001 | Lee et al. | ............. 438/278 |
| 6,448,112 B1 | * | 9/2002 | Lee | ........... 438/128 |
| 6,468,869 B1 | * | 10/2002 | Yang et al. | ............ 438/278 |
| 6,569,705 B1 | * | 5/2003 | Chiang et al. | ............. 438/95 |
| 6,569,714 B1 | * | 5/2003 | Becker | ........... 438/128 |
| 6,576,518 B1 | * | 6/2003 | Yamada et al. | ........... 438/275 |

(Continued)

FOREIGN PATENT DOCUMENTS

JP    2000-277631    6/2000

*Primary Examiner*—Matthew Smith
*Assistant Examiner*—Khiem Nguyen
(74) *Attorney, Agent, or Firm*—Fish & Richardson P.C.

(57) ABSTRACT

The method of manufacturing a semiconductor device comprises the steps of: forming a gate electrode on a semiconductor substrate through a gate insulated film; forming source/drain regions to be adjacent to the gate electrode forming an Al wiring through an interlayer insulating film covering the gate electrode; and implanting impurity ions into a surface of the semiconductor substrate using as a mask the Al wiring and a photoresist formed thereon, thereby writing information into each of elements constituting a mask ROM and changing an outputting manner at an output port.

12 Claims, 6 Drawing Sheets

U.S. PATENT DOCUMENTS 6,630,721 B1 * 10/2003 Ligon .................... 257/413
6,828,622 B1 * 12/2004 Kitamura et al. ........... 257/316
7,084,463 B1 * 8/2006 Yamada et al. ............ 257/368
2002/0130423 A1 * 9/2002 Yamada et al. ............ 257/783
2002/0163034 A1 * 11/2002 Lee ...................... 257/315

* cited by examiner

METHOD OF MANUFACTURING SEMICONDUCTOR DEVICE

BACKGROUND OF THE INVENTION

This invention relates to a method of manufacturing a semiconductor device, and more particularly to a manufacturing technique of changing an outputting manner at an output port at the time of writing information into each of elements which constitute a mask ROM (Read Only Memory).

In order to shorten the TAT (Turn Around Time) of a mask ROM, various techniques of ion-implanting for writing information (which is also referred to as "program write" or "ROM write") after an Al wiring has been formed are known. Referring to FIGS. 6A to 6D, an explanation will be given of a conventional manufacturing technique.

Step 1: As seen from FIG. 6A, using the technique of thermal oxidation or CVD, a pad oxide film 52 of a silicon oxide film having a thickness of 25 nm is formed on a P-type semiconductor substrate 51. The pad oxide film 52 is formed to protect the surface of the semiconductor substrate 51.

Next, a silicon nitride film 53 which is an oxidation-resistant film is formed on the entire surface. Thereafter, lengthy stripes of openings 53a for forming element isolation films 54 are formed in the silicon nitride film 53 in a direction perpendicular to a paper face of this drawing.

Step 2: As seen from FIG. 6B, using the technique of LOCOS with the silicon nitride film as a mask, the semiconductor substrate 51 is oxidized to form element isolation films 54. At this time, oxide regions invades between the semiconductor substrate 51 and silicon nitride film 53 so that a bird's beaks 54a are formed. Next, the silicon nitride film 53 and pad oxide film 52 are removed, and using the technique of thermal oxidation, a gate insulating film 55 having a thickness of 14 nm to 17 nm is formed. Using the technique of CVD, a poly-Si film having a thickness of 350 nm is formed, and phosphorus is doped to form an N-type conductive film 56.

Step 3: As seen from FIG. 6C, the conductive film 56 is etched in lengthy strips in a direction orthogonal to the element isolation films 54 (it should be noted that the etched region, which is in parallel to the paper face, is not illustrated) to form gate electrodes 56a which serve as word lines. Using the gate electrodes 56a as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed. An interlayer insulating film 57 having a thickness of 500 nm of a silicon oxide film is formed on the entire surface. Al wirings 58 in lengthy strips, which serve as bit lines, are formed above the element isolation films 54, respectively in a direction perpendicular to the paper face. Until this step, the manufacturing process can be carried out irrespectively of what program should be written in the memory cell transistors. For this reason, the wafers can be previously manufactured. In this case, a silicon oxide film 59 serving as a protection film is formed on the entire surface.

Step 4: At the time when a program to be written is determined on receipt of a request from a customer, as seen from FIG. 6D, a photoresist 60 having openings 60a for writing a program for a mask ROM is formed. P type impurities such as boron are ion-implanted in the semiconductor substrate 51 immediately beneath the gate electrodes 56a from the openings 60a so that predetermined memory cell transistors are depleted. Thus, the threshold voltages of the memory cell transistors are lowered so that a ROM data is written.

Now, in changing the mask ROM, the outputting manner of an output port for each user must be changed into either an open drain output or an inverter output.

In this case, as the step of changing the outputting manner at the output port, the operation of depleting a P-channel MOS transistor was performed by implanting boron ions before a gate electrode is formed.

Where the changing the outputting manner at an output port is performed by the step of ion-implanting before the gate electrode is formed, this step is a very early step. Therefore, the advantage of performing the step of writing the ROM data as a later step is lost.

Further, the opening of the photoresist film which is used when the switch for changing the outputting manner at the output port is formed is smaller than the opening for writing the ROM, and the openings for forming switches are formed adjacently to each other so as to correspond to a plurality of pads 32 (FIG. 4A).

However, the ROM 29 and PD switches 30 are formed in a certain limited area of the substrate (chip) 1 (For example, although not illustrated, an SRAM region and logic unit region are formed in a wider area than the ROM region). Therefore, no opening is formed in the other relatively wide region than the opening for write of the ROM and openings for the PD switches so that the proportion of the area of the photoresist film is large.

Owing to the tension from the photoresist film with no opening, which occupies a wide region on the chip, the sectional shape of the openings are not substantially vertical but tilt. Thus, the diameter of each of the openings at its upper part is increased.

Therefore, if the interlayer insulating film is etched as it is, the etching proceeds in reflection of the above tilting. As a result, an etched shape leaves the interlayer insulating film on the transistor in which the write for the ROM and the outputting manner of the output port should be switched. Particularly, this greatly influences the openings for the switches each of which has a smaller than that of the opening for write of the ROM and which are adjacent to each other so as to correspond to the plurality of pads 32.

As a result, as the case may be, impurities are not sufficiently implanted in the channel region of the transistor for which the write of ROM is to be carried out and to be switched, thus defective write and switching occurs.

SUMMARY OF THE INVENTION

In view of the problem described above, the method of manufacturing a semiconductor device according to this invention comprises the steps of forming a gate electrode on a semiconductor substrate through a gate insulated film; forming source/drain regions to be adjacent to the gate electrode; forming a metallic wiring through an interlayer insulating film covering the gate electrode; and implanting impurity ions into a surface of the semiconductor substrate using as a mask the metallic wiring and a photoresist formed thereon, thereby writing information into each of elements constituting a mask ROM and changing an outputting manner at an output port, and the step of changing an outputting manner at an output port is to form a switch for changing an output to a pad into an open drain output or an inverter output. Preferably, openings for forming switches is formed using a photoresist film with a recess portion so as to be adjacent to the openings.

DETAILED DESCRIPTION OF THE PREFERRED EMBODIMENT

Figure 1A:
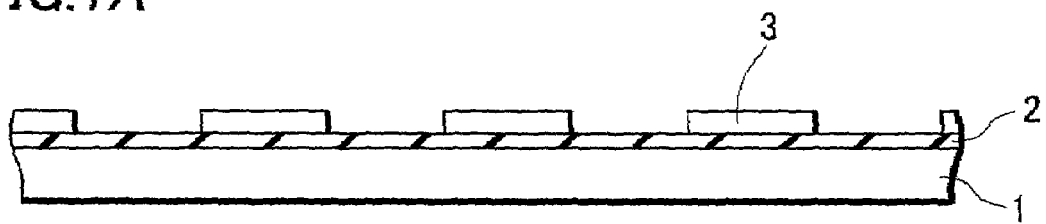
FIGS. 1A to 1C are sectional views for explaining a method of manufacturing a semiconductor device according to the invention.

Now referring to the drawings, an explanation will be given of the first embodiment of the method of manufacturing a semiconductor device according to this invention.

Step 1: As seen from FIG. 1A, like the step 1 in the conventional manufacturing process, a pad oxide film 2 is formed on a semiconductor substrate 1 to form a silicon nitride film 3 having openings.

Figure 1B:
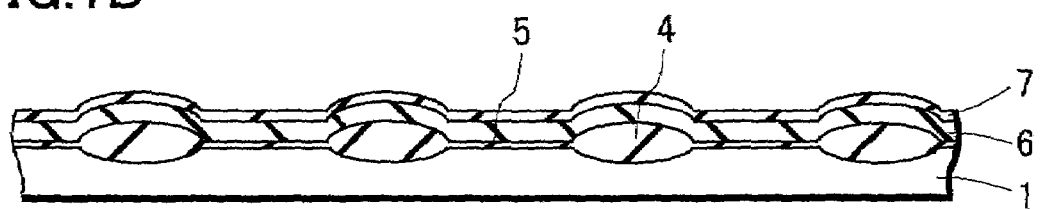

Step 2: As seen from FIG. 1B, using the silicon nitride film 3 on the semiconductor substrate 1 as a mask, by the technique of LOCOS, the semiconductor substrate 1 is oxidized to form an element isolation film 4.

Next, the pad oxide film 2 and the silicon nitride film 3 are removed. A gate oxide film 5 having a thickness of 14 nm to 17 nm is formed by thermal oxidation. A poly-silicon film having a thickness of 100 nm is formed by CVD, and is doped with phosphorous to form an N-type conductive film 6.

Further, a silicide film 7 of refractory metal such as tungsten having a thickness of 150 nm is formed. The silicide film 7 as well as the conductive film 6 serves as a gate electrode, and reduces the electric resistance of the gate electrode and has a function of protecting the gate electrode as described above.

Figure 1C:
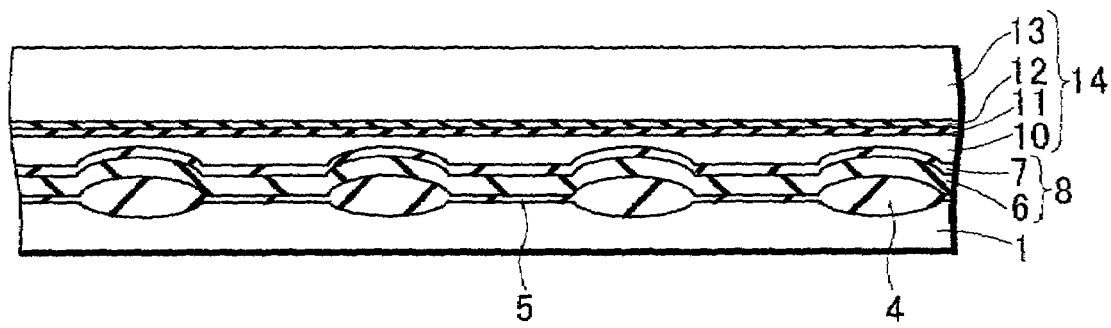

Step 3: As seen from FIG. 1C, the conductive film 6 and the silicide film 7 are etched in the form of a lengthy strip in a direction orthogonal to the element isolation film 4 (it should be noted that the etched region, which is in parallel to the paper face of the drawing, is not illustrated) to form gate electrodes 8 which serve as word lines.

Using the gate electrode 8 as a mask, P-type impurities such as boron are ion-implanted to form a source region and a drain region (which are not illustrated since they are formed beneath both ends of the gate electrode in a direction perpendicular to the paper face).

Through the process described above, memory cell transistors arranged in a matrix shape are formed.

By CVD, a first interlayer insulating film 14 having a thickness of 500 nm, including a silicon oxide film 10, a silicon nitride film 11, poly-silicon film 12 and a silicon oxide film 13 is formed on the entire surface. The poly-silicon film 12 serves as an etching stopper when the interlayer insulating film 1 is etched as described above.

Figure 2A:
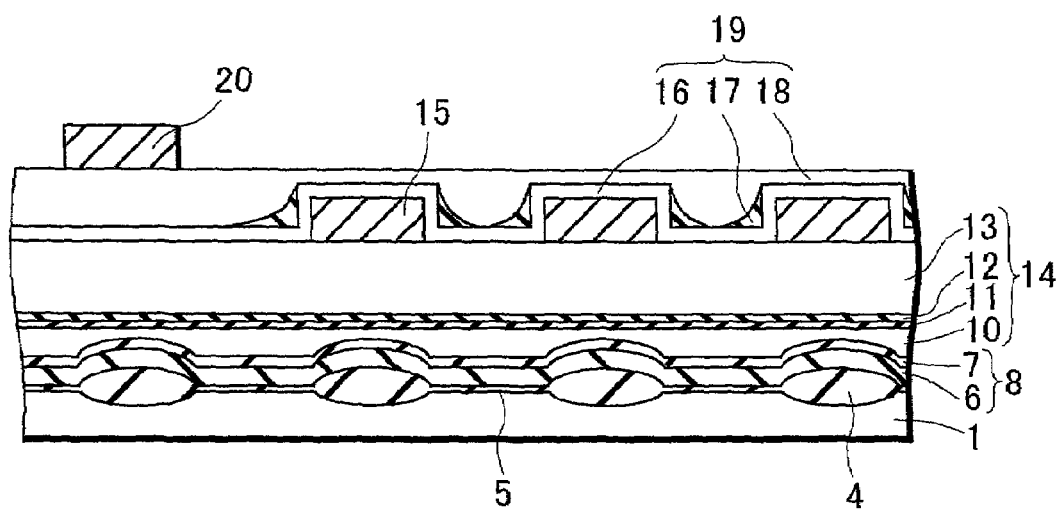
FIGS. 2A and 2B are sectional views for explaining a method of manufacturing a semiconductor device according to the invention.
Figure 2B:
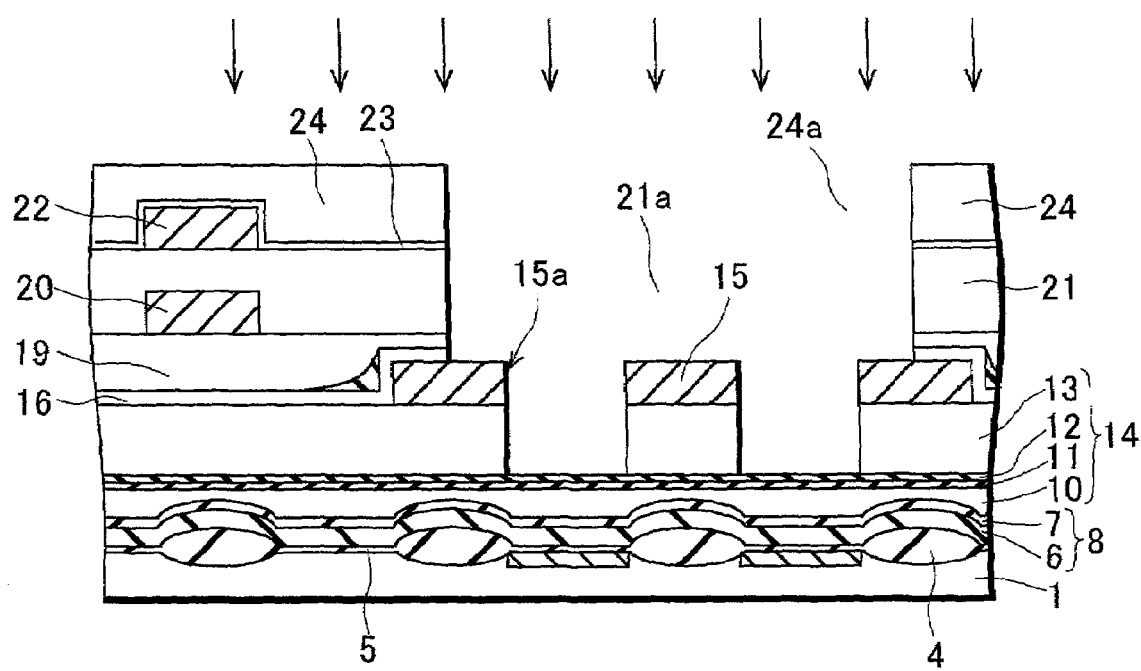

Step 4: As seen from FIG. 2A, a metallic film of an Al film is formed on the interlayer insulating film 14. The metallic film is patterned to form first Al wirings 15 each of which is a bit line. In this case, the first Al film 15 is formed so that its end (see FIG. 2B) is located immediately above the end of the element isolation film 4.

A second interlayer film 19 having a thickness of 600 nm and including three layers of a silicon oxide film 16, SOG film 17 and a silicon oxide film 18 is formed on the entire surface for flattening the device. Subsequently, a metallic film of an Al film is formed on the interlayer insulating film 19 and patterned to form a second Al wiring 20.

Step 5: As seen from FIG. 2B, a third interlayer insulating film 21 having a thickness of 600 nm is formed on the entire surface so as to cover the second Al wiring 20. A metallic film of e.g. an Al film is formed on the third interlayer insulating film 21. The metallic film is patterned to form a third Al wiring 22.

Until this step, the wafer can be manufactured irrespectively of the program to be written into a memory cell transistor. Therefore, a number of wafers can be manufactured beforehand. In this case, in order to protect the metallic wiring and prevent its corrosion, a protection film 23 of e.g. a thin silicon oxide film having a thickness of about 50 nm is formed on the surface of the metallic wiring layer.

Step 6: At the time when a program to be written is determined on receipt of a request from a customer, as seen from FIG. 2B, a photoresist 24 having a thickness of 1000 nm is formed on the entire surface, and subjected to exposure and development to make an opening 24a above a prescribed memory cell. In this case, the opening 24a is caused to have a larger size than that of an implanting region so that the ends 15a of the Al wirings 15 are exposed. Next, using the photoresist 24 and Al wiring 15 as a mask, the interlayer insulating film 14 is etched. The etching is carried out in a manner of anisotropic etching so that the interlayer insulating film 14 having a thickness of 100 nm above from the gate electrode remains.

Further, P-type impurities such as boron are ion-implanted into the semiconductor substrate 1 immediately beneath the gate electrode 8 from an opening 21a so that a prescribed memory cell transistor is depleted. As described above, the end of the Al wiring 15 is located immediately above the end of the element isolation film 4. Therefore, using the Al wring as a mask, the ion-implanting can be carried out more precisely. Thus, the threshold value of the memory cell transistor is reduced so that the ROM data is written.

Through the process described above, a mask ROM with a prescribed program can be completed.

The feature of this invention resides in that the outputting manner at an output port is changed in the same step as the step of writing the ROM data in the mask ROM.

An explanation will be given of a circuit of changing an outputting manner at an output port according to this invention.

Figure 3:
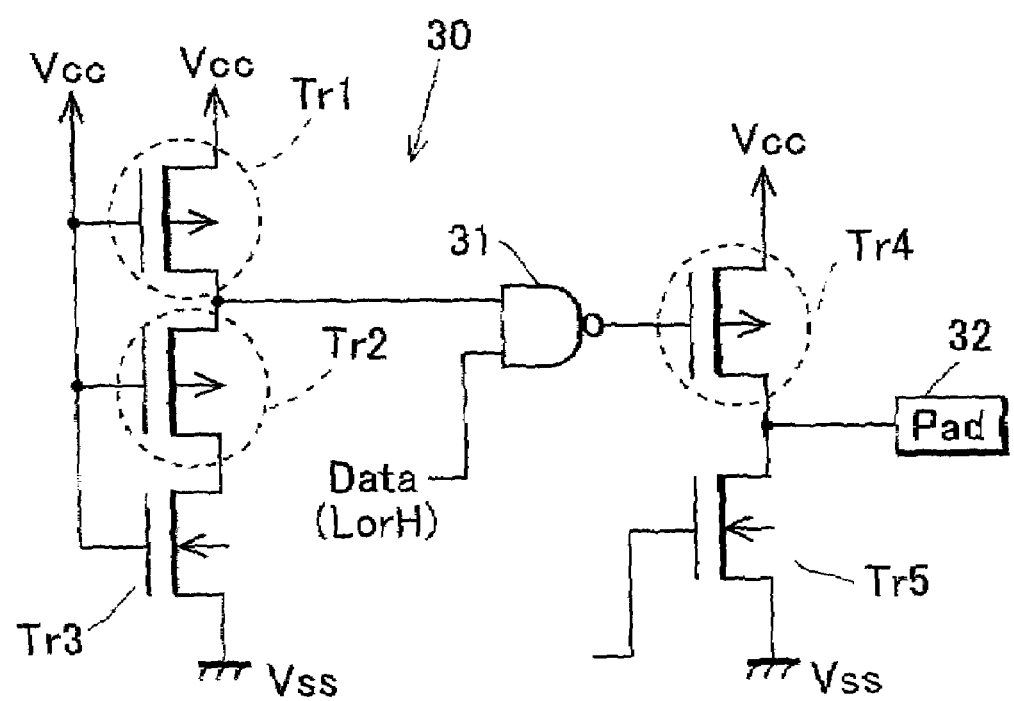
FIG. 3 is a circuit diagram for explaining output port according to the invention.

As seen from FIG. 3, between a power source voltage Vcc and a grounding voltage Vss, a P-channel MOS transistor Tr1, a P-channel MOS transistor Tr2 and an N-channel MOS transistor Tr3 are connected in series; a signal produced from a junction point between the P-channel MOS transistor Tr1 and the P-channel MOS transistor Tr2 is supplied to the one input of a NAND circuit 31 whereas the data at an L level or H level is supplied to the other input thereof. Incidentally, the gate of each of the P-channel MOS transistor Tr1, P-channel MOS transistor Tr2 and N-channel MOS transistor Tr3 is connected to the power source voltage Vcc.

The output from the NAND circuit 31 is supplied to the gate of a P-channel MOS transistor Tr4 which is connected in series with an N-channel MOS transistor Tr5 between the power source voltage Vcc and the grounding voltage Vss.

Further, a junction point of the P-channel MOS transistor Tr4 and the N-channel MOS transistor Tr5 is connected to a pad 32.

In this embodiment, boron ions are implanted in the above P-channel MOS transistor Tr2 so that it is depleted, thereby providing a switch 30 (which is hereinafter referred to as a PD switch 30 since the P-channel MOS transistor is depleted).

The outputting manner at the output port will be explained below.

As descried above, the P-channel MOS transistor Tr2 is depleted so that the one input of the NAND circuit 31 falls in an "L" level. Therefore, irrespectively of the other input data, an H level output is produced from the NAND circuit 31. Then, the P-channel MOS transistor Tr4 turns off.

As a result, the pad is connected to the drain of the N-channel MOS transistor Tr5 to provide an open drain output.

On the other hand, an explanation will be given of an outputting manner at the output port in the case where the P-channel MOS transistor Tr1 is depleted.

In this case, the one input of the NAND circuit becomes an "H" level. Therefore, the above P-channel MOS transistor Tr4 is on/off controlled by the data supplied to the other input of the NAND circuit 31. Thus, the outputting manner of the pad provides an inverter output.

In this invention, the step of writing information in the mask ROM and the step of changing the outputting manner at the output port are carried out in the same step.

Figure 4A:
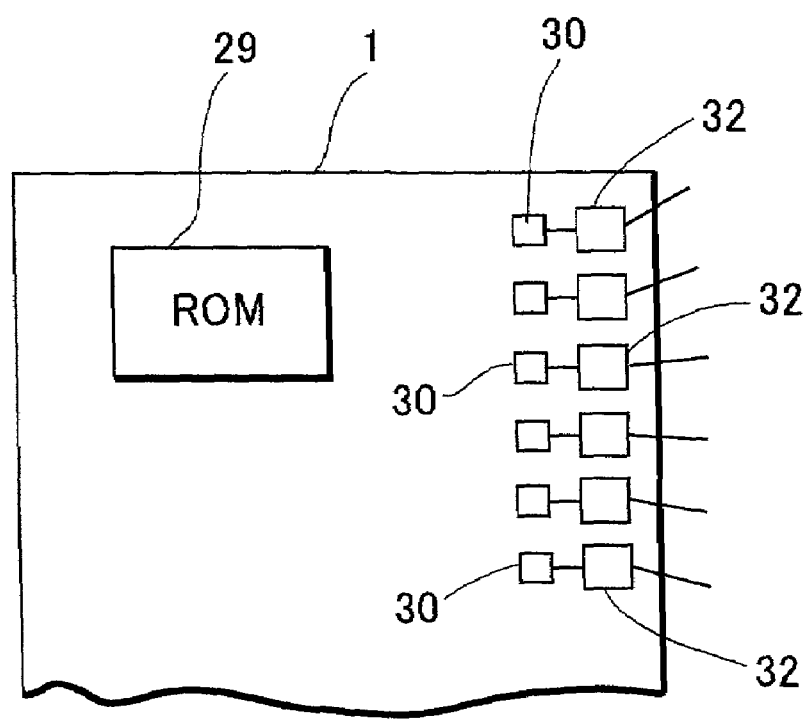
FIGS. 4A and 4B are plan views for explaining a semiconductor device according to the invention.

Specifically, as seen from FIG. 4A, PD switches 30 connected to the ROM 29 and the pads 32 (connecting portions are not shown) and for making the outputting manner optionally selectable are formed in the same substrate in the same ion-implanting step as the step of writing a program. This does not increase the number of manufacturing steps. In addition, in this embodiment, in order to shorten the TAT, the PD switch is formed by "later execution of ROM write", i.e. performing ROM write after the Al wiring 15 has been formed. This shortens the TAT as compared with the conventional ion-implanting step before the gate electrode is formed. Further, in this step, the mask for the ROM write has only to be changed to change the outputting manner at the output port.

Figure 5A:
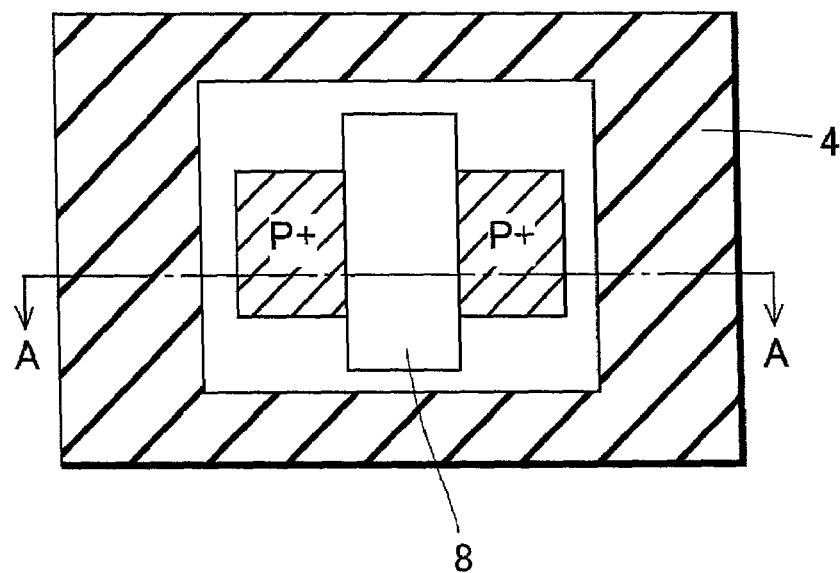
FIGS. 5A and 5B are sectional views for explaining a semiconductor device according to the invention.
Figure 5B:
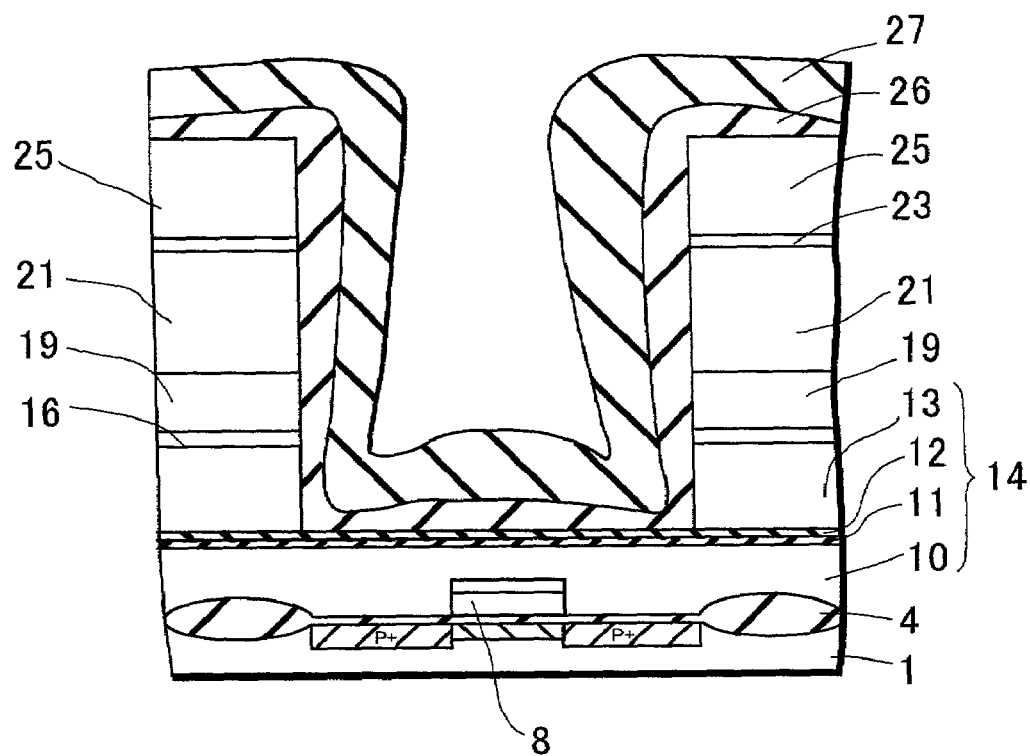
Figure 6A:
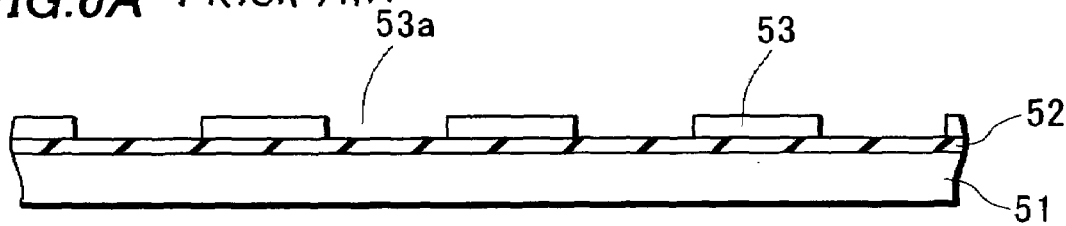
FIGS. 6A to 6D are sectional views for explaining a conventional semiconductor device.
Figure 6B:
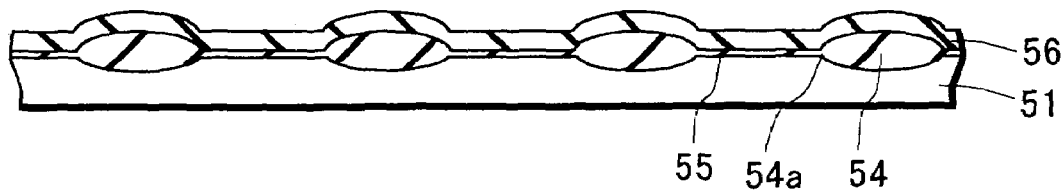
Figure 6C:
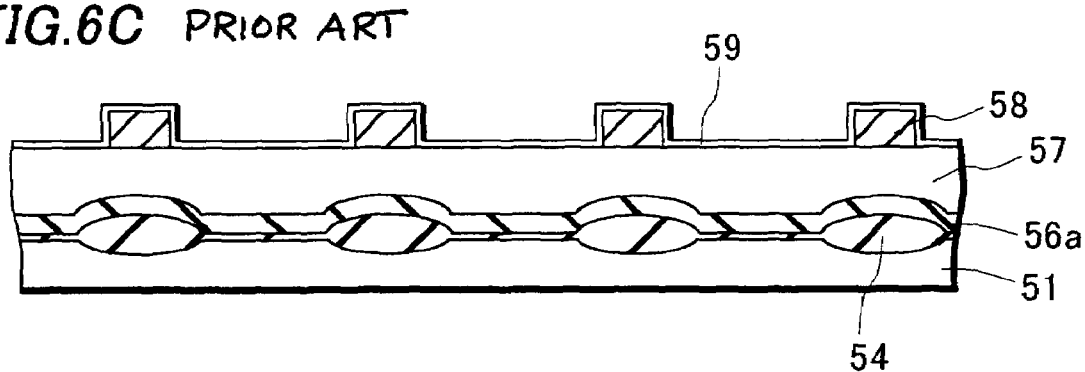
Figure 6D:
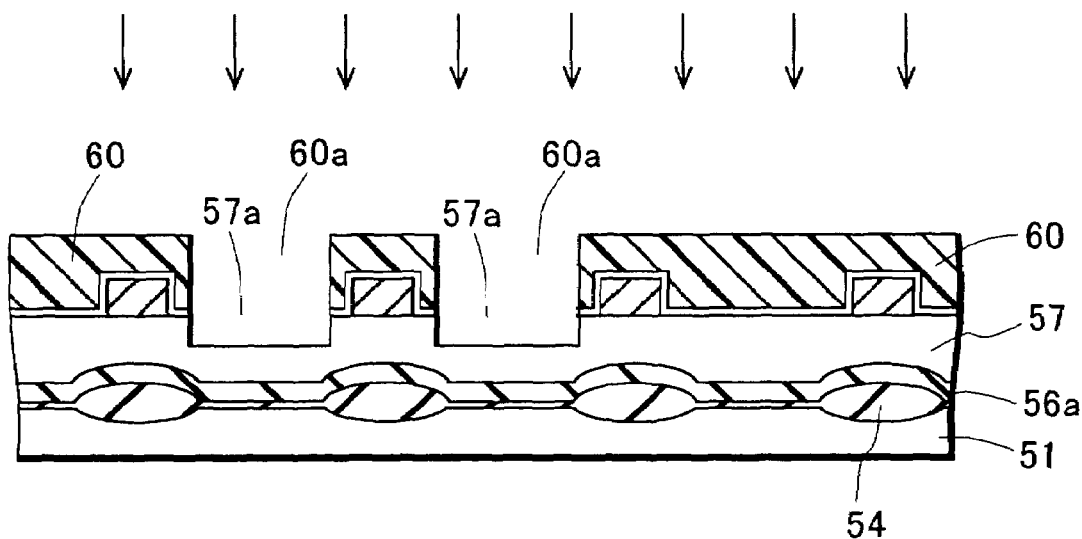

FIG. 5A is a plan view of the above PD switch 30. FIG. 5B is a sectional view taken in line A—A in FIG. 5A. Incidentally, FIG. 5A is a view illustrating an opening area for forming a PD switch, in which the films to be formed on the element isolation film 4 and gate electrode 8 are not illustrated.

The second embodiment of this invention will be explained below.

Figure 4B:
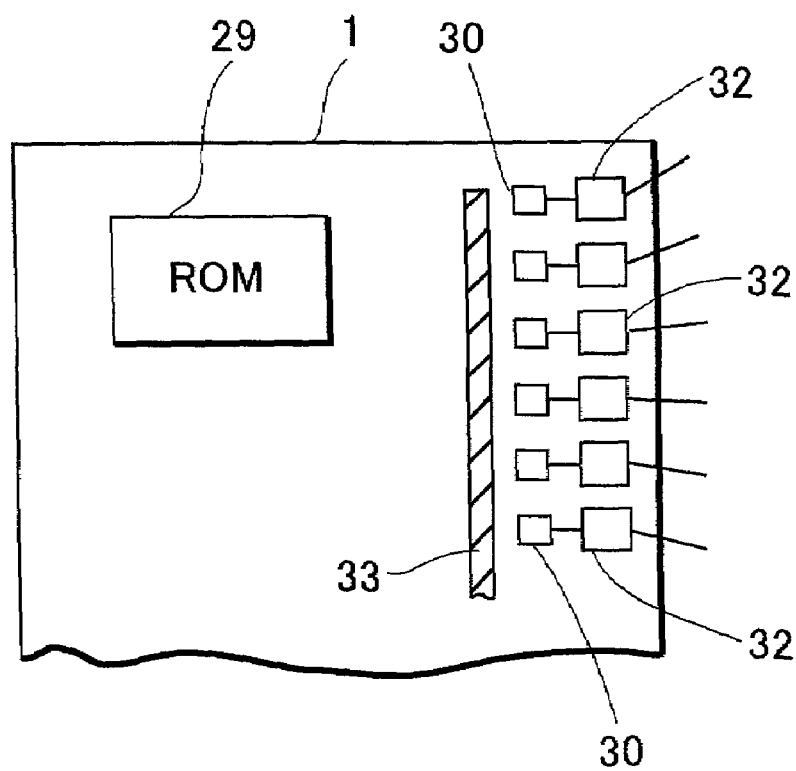

The feature of this embodiment resides in that in the photoresist film 24 having an opening for ROM write and openings for forming the PD switches in the first embodiment, a recess portion 33 adjacent to the PD switches 30 is formed, and using the photoresist film thus formed, the openings for ROM write, forming the PD switches and recess portion 33 are formed (see FIG. 4B).

The second embodiment, in which the recess portion 33 is formed adjacently to the openings for forming the PD switches, can solve the problem that owing to the tension from the photoresist film with no opening occupying a wide area on the chip, the sectional shape of the openings are not substantially vertical but tilt, the etched shape includes the interlayer insulating film remaining on the transistor to be switched in the outputting manner at the output port and the impurities are not sufficiently implanted in the channel region of the transistor to be switched, which results in poor switching.

Further, the second embodiment permits the shape of the opening for ROM to be written stabilized and can solve the problem that the impurities are not sufficiently implanted in the channel region of the transistor to be switched, which results in poor switching.

By forming a film serving as an etching stopper beneath the recess portion 33 when the recess portion 33 is formed by etching, the wiring below the recess portion 33 is prevented from being cut. For example, by forming the etching stopper film by the same film as the upper layer wiring, the lower layer wiring formed beneath the etching stopper is prevented from broken.

The technical idea of this invention can be easily applied to the case where a number of metallic wiring layers are formed.

In the step 3 of in each of the embodiments described above, the gate electrode maybe formed by the process including the steps of a poly-silicon film, patterning the poly-silicon and selectively forming a silicide film on the poly-silicon film.

Incidentally, although the P-type semiconductor substrate was used in each of the embodiments described above, in place of it, an N-type semiconductor substrate or a well region formed on the semiconductor substrate may be adopted.

In each of the embodiments described above, the ion-implanting for depletion to reduce the threshold voltage was explained, but in place of it, the ion-implanting to boost the threshold voltage may be carried out for write of a program.

The switch should not be limited to the PD switch, but an ND switch which can be provided by depleting an N-channel MOS transistor.

The application field of this invention should not be limited to the method of writing a program in a mask ROM and of changing the outputting manner at an output port. This invention can be applied to various products.

In accordance with this invention, by performing the step of writing information in a mask ROM and the step of changing the outputting manner at an output port in the same step, The number of manufacturing steps is not increased. In addition, in a process of "later execution of ROM write", i.e. performing ROM write after the Al wiring has been formed in order to shorten the TAT, a circuit for switching the outputting manner at the output port is provided.

This shortens the TAT as compared with the method of changing the outputting manner at the output port by the ion-implanting step before the gate electrode is formed.

Further, the mask for the ROM write has only to be changed to change the outputting manner at the output port.

Further, in the photoresist film having openings in the interlayer insulating film in order to form the switches capable of changing the outputting manner at the output port, the recess portion is formed adjacently to the openings for forming the switches. This can solve the problem that the openings of the photoresist film tilt so that the shapes of the openings are unstable and the ions are sufficiently implanted in the transistor to be switched, which results in poor switching.

What is claimed is:

1. A method of manufacturing a semiconductor device comprising:
   forming a gate electrode on a semiconductor substrate through a gate insulated film;
   forming source/drain regions to be adjacent to said gate electrode;
   forming an interlayer insulating film above the gate electrode, wherein the interlayer insulating film comprises:
      a first layer that serves as an etching stopper; and
      a second layer above the first layer;
   forming metallic wiring through an interlayer insulating film covering said gate electrode;
   covering a portion of the metallic wiring with a photoresist but providing an opening for impurities to access the substrate such that the metallic wiring is exposed at all side surfaces of the opening, wherein the opening penetrates the second layer and reaches the first layer; and
   implanting impurity ions into a surface of said semiconductor substrate using an exposed portion of said metallic wiring and the photoresist as a mask,
   wherein (i) writing information into each element constituting a mask ROM and constituting a switch which is connected to a pad, and (ii) changing an outputting manner at an output port, are carried out by said implanting impurity ions in a single implanting operation.

2. The method of manufacturing a semiconductor device according to claim 1 further comprising:
   forming openings for forming switches using said photoresist film, wherein said photoresist film includes a recess portion provided to be adjacent to said openings, and said openings makes said outputting manner at said output port changeable.

3. The method of manufacturing a semiconductor device according to claim 1, wherein the exposed portion of said metallic wiring is exposed through the photoresist during the implanting.

4. The method of claim 1, wherein the opening includes at least one of vertical sides of the metallic wiring exposed to allow the impurities to access the substrate.

5. The method of manufacturing a semiconductor device according to claim 1, wherein the metallic wiring used as a mask is exposed through the photoresist.

6. A method of manufacturing a semiconductor device comprising:
   forming a gate electrode on a semiconductor substrate through a gate insulated film;
   forming source/drain regions to be adjacent to said gate electrode;
   forming a metallic wiring through an interlayer insulating film covering said gate electrode;
   covering the metallic wiring with a photoresist but providing an opening for impurities to access the substrate; and
   implanting impurity ions into a surface of said semiconductor substrate using said metallic wiring and the photoresist as a mask,
   wherein writing information into each element constituting a mask ROM and changing an outputting manner at an output port occur in the same implanting operation;
   wherein changing an outputting manner at an output port is to form a switch for changing an output to a pad into one of an open drain output and an inverter output by implanting ions in a desired transistor.

7. The method of manufacturing a semiconductor device according to claim 6 further comprising:
   forming openings for forming switches using said photoresist film, wherein said photoresist film includes a recess portion provided to be adjacent to said openings, and said openings makes said outputting manner at said output port changeable.

8. The method of manufacturing a semiconductor device according to claim 6, wherein a metallic wiring used as a mask is exposed.

9. The method of claim 6, wherein the opening includes at least one of vertical sides of the metallic wiring exposed to allow the impurities to access the substrate.

10. A method of manufacturing a semiconductor device comprising:
    forming a gate electrode on a semiconductor substrate through a gate insulated film;
    forming source/drain regions to be adjacent to said gate electrode;
    forming a metallic wiring through an interlayer insulating film covering said gate electrode;
    covering the metallic wiring with a photoresist but providing an opening for impurities to access the substrate such that the metallic wiring is exposed at all side surfaces of the opening; and
    implanting impurity ions into a surface of said semiconductor substrate using said metallic wiring and the photoresist as a mask,
    wherein (i) writing information into each element constituting a mask ROM and constituting a switch which is connected to a pad, and (ii) changing an outputting manner of the switch to either an open drain outputting manner or an inverter outputting manner depending on a location of the ion implantation, are carried out by said implanting impurity ions.

11. The method of manufacturing a semiconductor device according to claim 10 further comprising:
    forming openings for forming switches using said photoresist film, wherein said photoresist film includes a recess portion provided to be adjacent to said openings, and said openings makes said outputting manner at said output port changeable.

12. The method of claim 10, wherein the opening includes at least one of vertical sides of the metallic wiring exposed to allow the impurities to access the substrate.

* * * * *